(12) United States Patent
Chen et al.

(10) Patent No.: US 6,787,419 B2
(45) Date of Patent: Sep. 7, 2004

(54) METHOD OF FORMING AN EMBEDDED MEMORY INCLUDING FORMING THREE SILICON OR POLYSILICON LAYERS

(75) Inventors: Chung-Yi Chen, Taipei Hsien (TW); Jih-Wen Chou, Hsin-Chu (TW); Chih-Hsun Chu, Hsin-Chu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/248,363

(22) Filed: Jan. 14, 2003

(65) Prior Publication Data
US 2004/0137686 A1 Jul. 15, 2004

(51) Int. Cl.$^7$ .................... H01L 21/336; H01L 21/8234
(52) U.S. Cl. .................... 438/265; 438/275; 438/279; 438/301
(58) Field of Search ................ 438/128, 265, 438/279, 301; 435/275

(56) References Cited

U.S. PATENT DOCUMENTS

| | | | | | |
|---|---|---|---|---|---|
| 6,015,732 A | * | 1/2000 | Williamson et al. | ......... | 438/253 |
| 6,417,086 B1 | * | 7/2002 | Osari | ......... | 438/594 |
| 6,455,374 B1 | * | 9/2002 | Lee et al. | ......... | 438/257 |

* cited by examiner

Primary Examiner—W. David Coleman
Assistant Examiner—William M. Brewster
(74) Attorney, Agent, or Firm—Winston Hsu

(57) ABSTRACT

A wafer has a substrate defined with a first region and a second region. An ONO layer, a first silicon layer, and a silicon nitride layer are formed on the substrate in sequence. Then the ONO layer, the first silicon layer, and the silicon nitride layer disposed on the second region are removed. At least one gate oxide layer is formed on the second region and a second silicon layer is deposited on the wafer. After that, a photo-etching process is performed to remove the second silicon layer and the silicon nitride layer on the first region. At least a third silicon layer is formed on the wafer. Photo-etching processes and a plurality of ion implantation processes are then performed to form a gate, a drain, and a source of each MOS transistor on the substrate.

14 Claims, 10 Drawing Sheets

METHOD OF FORMING AN EMBEDDED MEMORY INCLUDING FORMING THREE SILICON OR POLYSILICON LAYERS

BACKGROUND OF THE INVENTION

1. Field of the Invention

The present invention relates to a method of forming an embedded memory, and more particularly, a method of forming an embedded memory having a flash memory structure.

2. Description of the Prior Art

With increasing integration, the present trend of manufacturing semiconductor integrated circuits is to integrate memory cell arrays and other circuit elements, such as a high-speed logic circuit element, onto a single chip. An embedded memory composed of memory cell arrays and logic circuits significantly reduces circuit area and increases the signal processing speed.

Please refer to FIG. 1 to FIG. 5. FIG. 1 to FIG. 5 are cross-sectional diagrams of a prior art method for manufacturing a metal-oxide-semiconductor (MOS) transistor of an embedded memory on a semiconductor wafer 10. As shown in FIG. 1. The semiconductor wafer 10 comprises a silicon substrate 12 defined with a memory array region 20 and a periphery circuit region 30. The memory array region 20 contains at least a first doped area 16, and the periphery circuit region 30 contains at least a second doped area 18 and a third doped area 19. Each area is separated by several shallow trench isolation (STI) structures 14.

As shown in FIG. 1, a bottom oxide 21, a silicon nitride layer 22, and a top oxide layer 24 are first formed on the surface of the semiconductor wafer 10 sequentially according to the conventional method of forming an embedded memory. These three layers are also called an oxide-nitride-oxide (ONO) layer 26. As shown in FIG. 2, a first photo-etching process is next performed to remove the ONO layer 26 in the peripheral circuit region 30 and to strip the residual photoresist layer on the surface of the semiconductor wafer 10 and the native oxide layer on the surface of the peripheral circuit region 30. A thermal oxidization process is then performed to form at least a gate oxide layer 28 on surface of the peripheral circuit region 30. As shown in FIG. 3, a chemical vapor deposition (CVD) process is performed to form a polysilicon layer 32 covering the memory array region 20 and the peripheral circuit region 30.

Thereafter, a second photo-etching process is performed to pattern the polysilicon layer 32 for forming a control gate of each NROM in the memory array region 20 and gate structures of each MOS transistor in the peripheral circuit region 30. As shown in FIG. 4, a first gate 34 is formed in the memory array region 20 and a second gate 36 and a third gate 38 are formed in the peripheral circuit region 30. As shown in FIG. 5, a plurality of ion implantation processes are performed with proper masks to form corresponding doped regions surrounding the first gate 34, the second gate 36, and the third gate 38, which serve as a source or a drain of each MOS transistor.

Since the NROM uses the nitride layer in the ONO layer as a charge trapping medium, electrons injected to the nitride layer through the tunneling of the MOS transistor are trapped therein due to the highly dense nitride layer. Thus, a various concentration distribution is formed and the distribution of the threshold voltage is thereby modified so as to achieve a function of memorizing. It is understood that the NROM is very sensitive to the quality of the ONO layers. However, in the conventional method of forming an embedded memory, a plurality of cleaning, etching, or thermal oxidizing processes are needed for fabricating circuit elements in the peripheral circuit region, such as forming the gate oxide layer on the surface of the peripheral circuit region. These processes cause the thickness loss of the ONO layer on the surface of the memory array region or deteriorate the quality of the ONO layer, significantly affecting the electric performance of the NROM and reducing the stability and reliability of the embedded memory.

Consequently, there is a strong need to develop a method of forming an embedded memory to solve the problem in the prior art method and improve the reliability of products.

SUMMARY OF INVENTION

It is therefore a primary objective of the claimed invention to provide a method of manufacturing a MOS transistor of an embedded memory to solve the aforementioned problem.

It is another objective of the claimed invention to provide a method of forming a SONOS non-volatile memory, such as an electrically erasable programmable read-only memory (EEPROM) or a flash memory.

In the preferred embodiment of the claimed invention, a method of forming a MOS transistor of an embedded memory is disclosed. First, a semiconductor wafer is provided. The semiconductor wafer comprises a substrate defined with a first region and a second region. Next, an ONO layer, a first silicon layer, and a silicon nitride layer are formed on the surface of the semiconductor wafer in turn. Then, a first photo-etching process is performed to remove the ONO layer, the first silicon layer, and the silicon nitride layer on the second region. After that, at least one gate oxide layer is formed on the second region. A second silicon layer is then formed on the surface of the semiconductor wafer. Thereafter, a second photo-etching process is followed to remove the second silicon layer and the silicon nitride layer on the first region. After forming at least a third silicon layer covering the semiconductor wafer, a photo-etching process is then performed to form a gate structure of each MOS transistor in the first region and the second region respectively. A plurality of ion implantation processes are performed in the first region to form a source and a drain of each MOS transistor in the first region. Then, a plurality of ion implantation processes are performed in the second region to form a source and a drain of each MOS transistor in the second region.

It is an advantage of the claimed invention that a silicon layer and a dielectric layer are formed on the ONO layer to protect the ONO layer from being affected by the following process so as to improve the reliability of the embedded memory significantly.

These and other objectives of the present invention will no doubt become obvious to those of ordinary skill in the art after having read the following detailed description of the preferred embodiment which is illustrated in the various figures and drawings.

DETAILED DESCRIPTION

Figure 1:
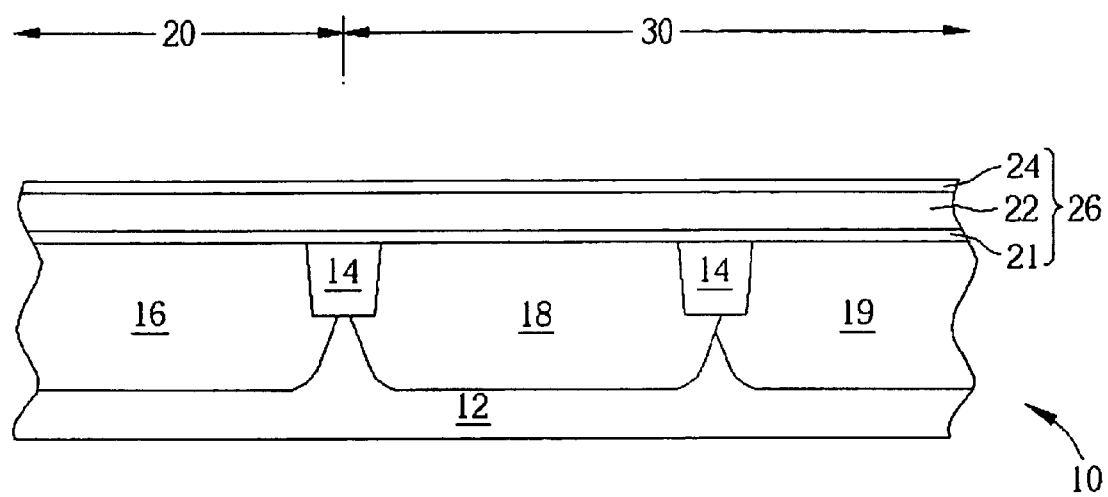
FIG. 1 to FIG. 5 are schematic diagrams of a conventional method of forming a MOS transistor in an embedded memory.
Figure 2:
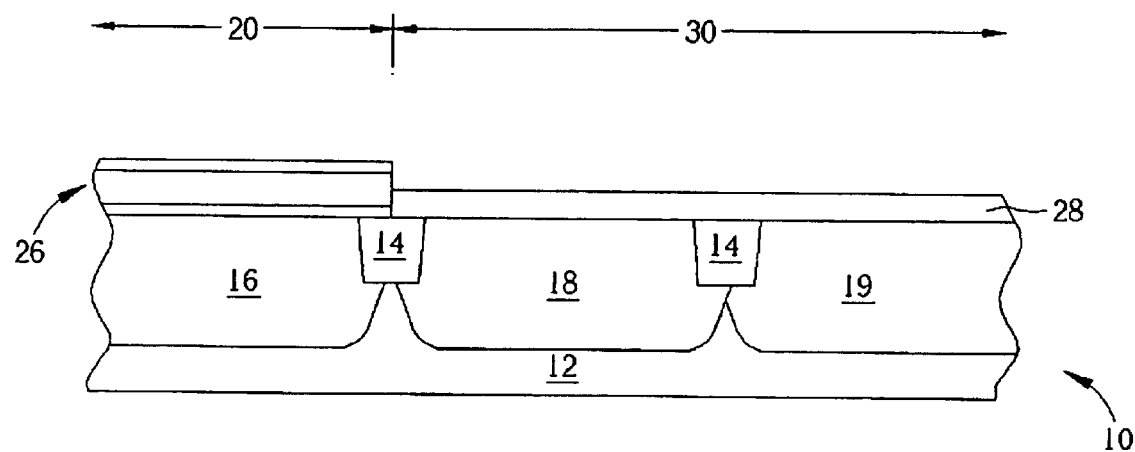
Figure 3:
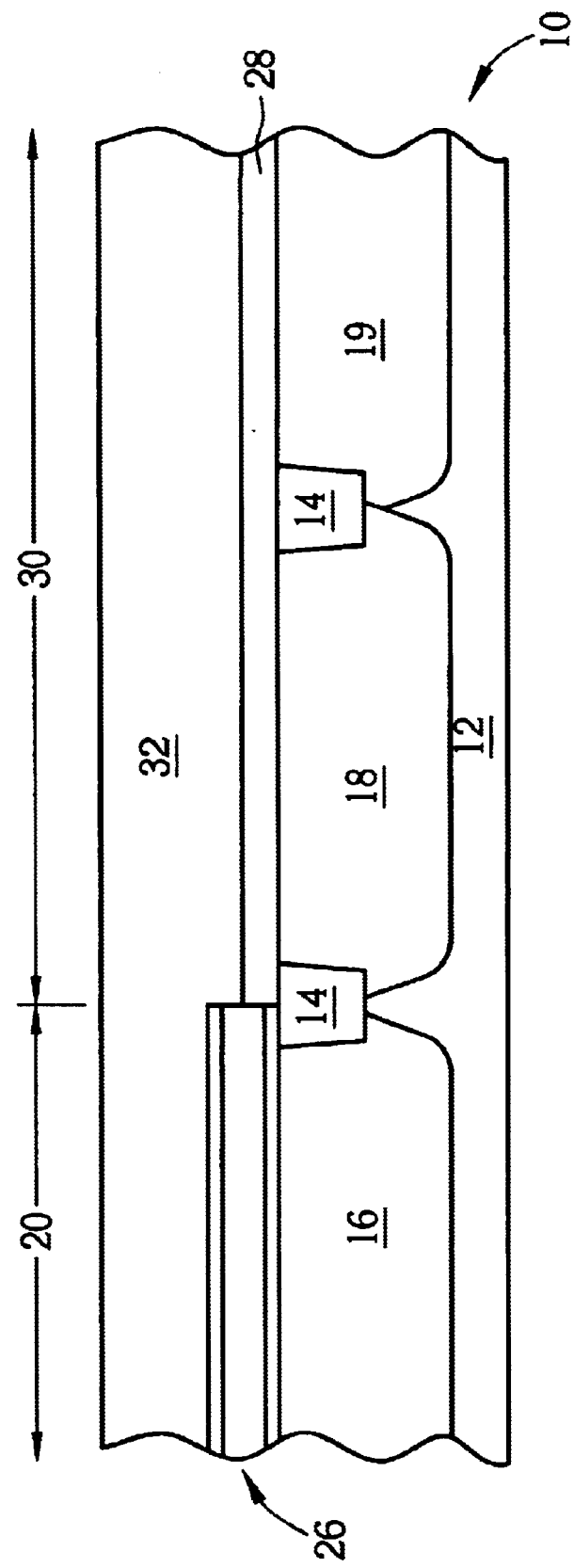
Figure 4:
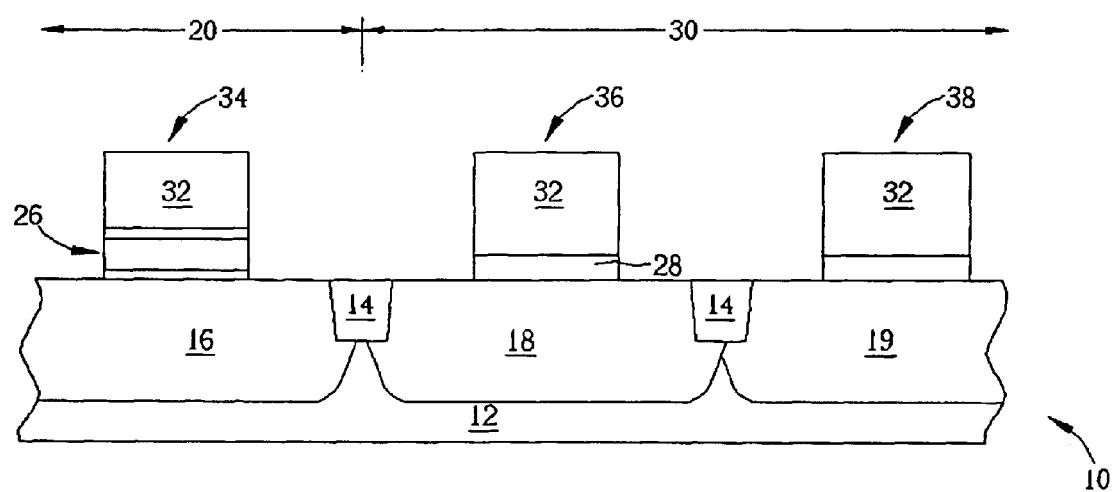
Figure 5:
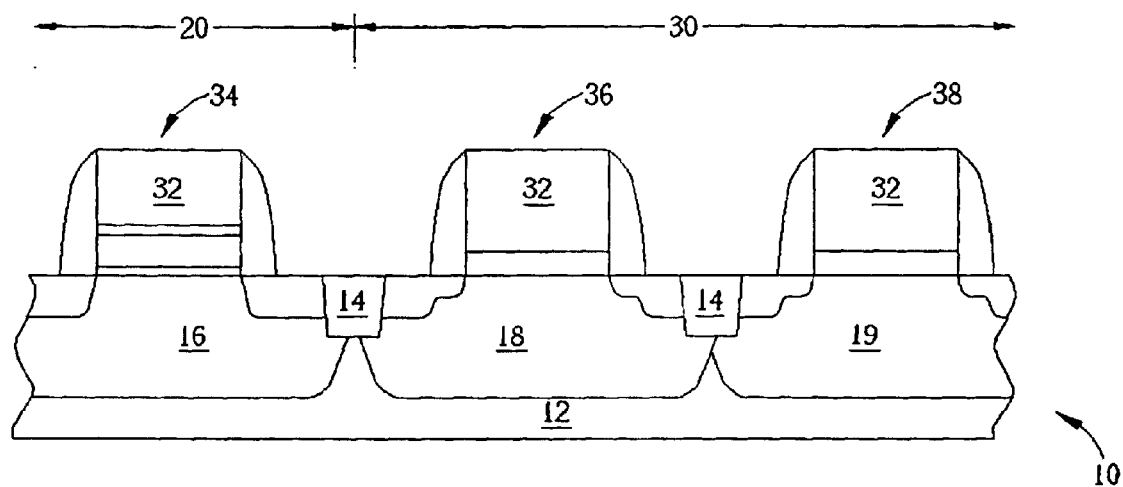
Figure 6:
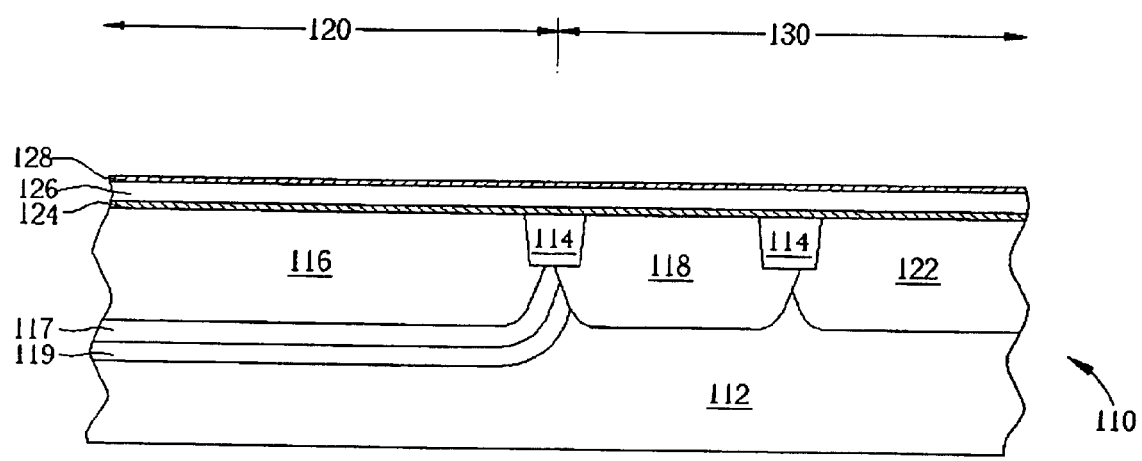
FIG. 6 to FIG. 10 are schematic diagrams of a method of forming a MOS transistor in an embedded memory according to the present invention.

Please refer to FIG. 6 to FIG. 10 of a method of forming a MOS transistor in an embedded memory according to the present invention. As shown in FIG. 6, a semiconductor wafer 110 is first provided. The semiconductor wafer 110 comprises a silicon substrate 112 defined with a first region 120 and a second region 130. In the preferred embodiment of the present invention, the first region 120 is used as a memory array region and the second region 130 is used as a peripheral circuit region. Several shallow trench isolation (STI) structures are used to separate the regions on the silicon substrate 112. A plurality of N type ion implantation processes and P type ion implantation processes are performed to form several doped areas in the surface of the silicon substrate 112. As shown in FIG. 6, the first region 120 comprises at least a cell well 116, a deep P-well 117, and a deep N-well 119 and the second region 130 comprises at least a P-well 118 and an N-well 122.

Then, an oxidizing process is used to form a bottom oxide layer on the surface of the silicon substrate 112, followed by a low pressure chemical deposition (LPCVD) process to form a silicon nitride layer on the bottom oxide layer as an charge trapping layer. After that, another LPCVD process is performed to form a top oxide layer on the silicon nitride layer. The bottom oxide layer, the silicon nitride layer, and the top oxide layer are also called an ONO layer 124. Thereafter, a first silicon layer 126 and a silicon nitride layer 128 are formed on the ONO layer 124 and covering the first region 120 and the second region 130. In the preferred embodiment of the present invention, the thickness of the bottom oxide layer, the silicon nitride layer, and the top oxide layer in the ONO layer 124 are 20, 50, and 45 angstroms respectively. The first silicon layer 126 comprises a polysilicon layer or an amorphous silicon layer with a thickness of about 300 to 800 angstroms. The thickness of the silicon nitride layer 128 is in a range of about 150 to 250 angstroms.

Figure 7:
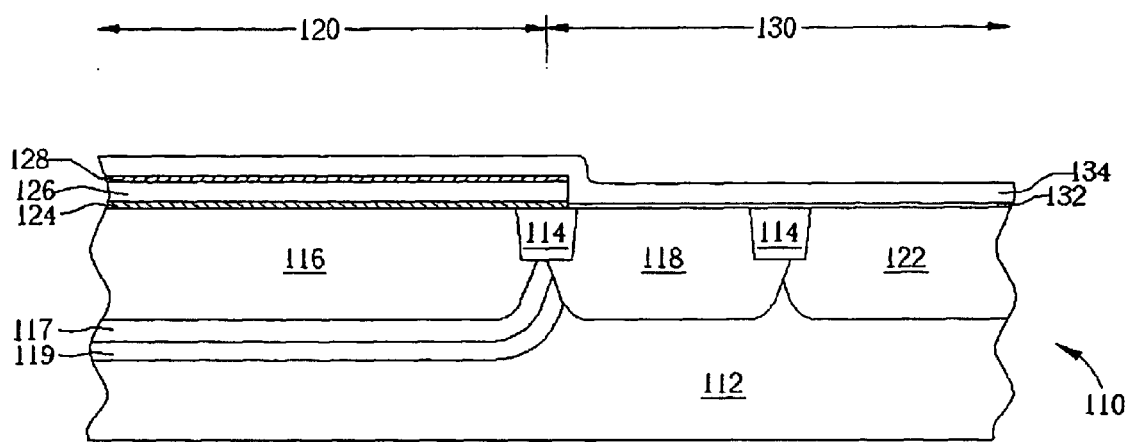

As shown in FIG. 7, a first photo-etching process is performed to remove the silicon nitride layer 128, the first silicon layer 126, and the ONO layer 124 in the second region 130 on the surface of the semiconductor wafer 110, followed by at least a cleaning process and at least a thermal oxidizing process to form at least a gate oxide layer 132 in the second region 130 on the silicon substrate 112. After that, a low pressure chemical vapor deposition process is performed to form a second silicon layer 134, which has a thickness of about 300 to 800 angstroms, on the semiconductor wafer 110. It Is noted that the silicon nitride layer 128 and the first silicon layer 126 covering the first region 120 are used to protect the underlying ONO layer 124 from being affected or damaged during the aforementioned cleaning process, thermal oxidizing process, or other following process.

Figure 8:
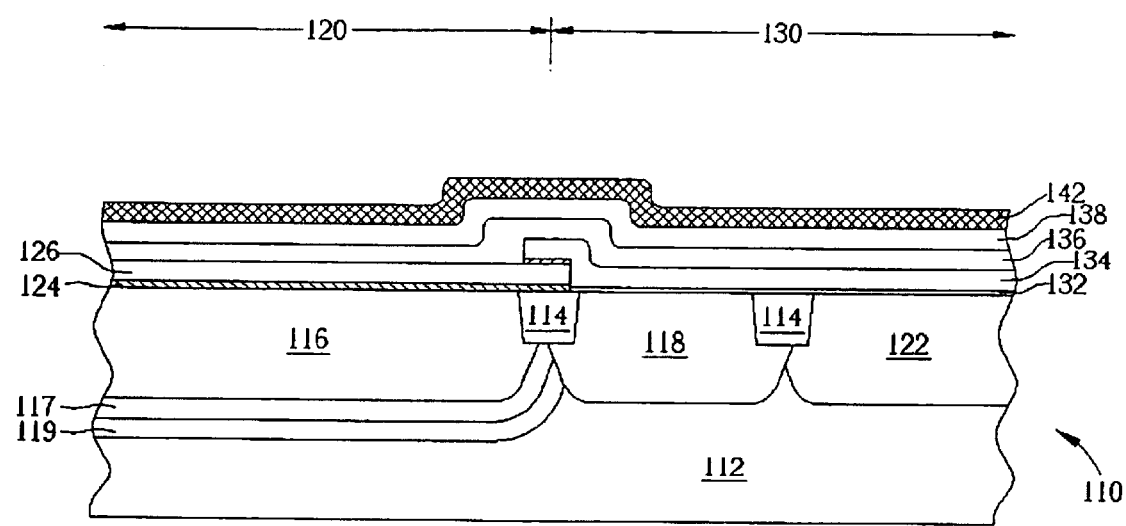

As shown in FIG. 8, a second photo-etching process is performed to remove the second silicon layer 134 and the silicon nitride layer 128 on the first region 120, followed by a chemical vapor deposition process to form a third silicon layer 126 on the semiconductor wafer 110 and covering the first region 120 and the second region 130. After that, some optional processes can be performed according to the requirements of products. For example, a silicide layer 138 and a dielectric layer 142 are formed in turn as illustrated in FIG. 8. The dielectric layer 142 can be composed of a silicon nitride layer or a silicon oxide layer. The second silicon layer 134 and the third silicon layer 136 are similar to the first silicon layer and can be composed of a polysilicon layer or an amorphous layer. In the preferred embodiment of the present invention, the dielectric layer 142 is composed of a silicon oxide layer and a silicon nitride layer. The thickness of the second silicon layer 134 and the third silicon layer 136 are both in a range of 300 to 800 angstroms. The suicide layer 138 is composed of a silicon tungsten (WSi) layer with a thickness of 500 angstroms.

Figure 9:
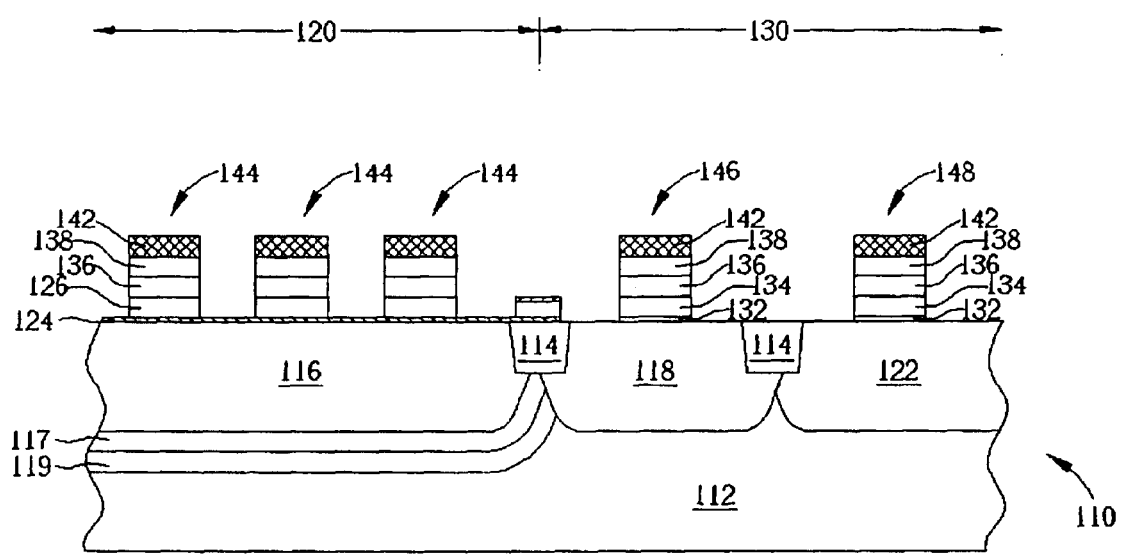

As shown in FIG. 9, a third photo-etching process is performed. A photoresist layer with predetermined patterns is formed on the surface of the dielectric layer 142 to define patterns of gate structures in the first region 120 and the second region 130. Then an etching process is then performed to etch along the patterns of the photoresist layer to form a plurality of first gate structure 144, second gate structure 146, and third gate structure 148 though only some gate structures are illustrated for simplicity. Each of the first gate structure 144 comprises two stacked layers, which are the first silicon layer 126 and the third silicon layer 136. Each of the second gate structure 146 and the third gate structure 148 comprises two stacked layers, which are the second silicon layer 134 and the third silicon layer 136, while the silicide layer 138 and the dielectric layer 142 are both optional designs.

Figure 10:
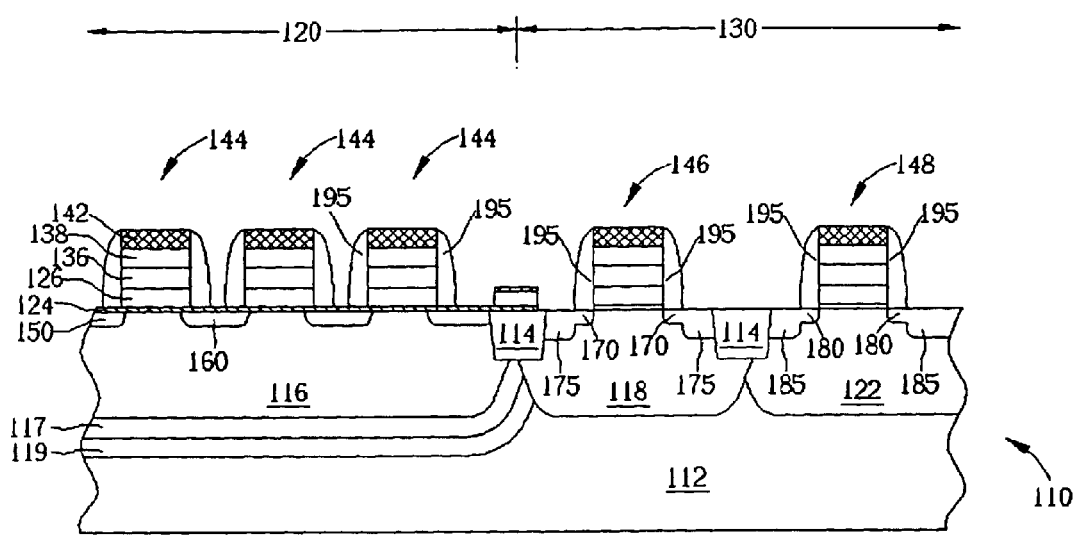

As shown in FIG. 10, at least one first region ion implantation process is performed to form a plurality of doped areas adjacent to the first gate structures 144 in the first region 120, which serve as sources 150 and drains 160. The source 150, the drain 160, and the first gate structure 144 are combined to form a stacked MOS transistor functioning as a memory cell of a SONOS flash memory or a SONOS EEPROM. In addition, the drain 150 extends along a direction of a bit line and electrically connects to a drain of a neighbor flash memory cell. In other words, the drain 150 serves as a bit line of the SONOS flash memory and the source 160 serves as a common source of two neighbor memory cells.

Next, at least a second region ion implantation process is performed. Using the spacer structure 195 surrounding the second gate structure 146 and the third gate structure 148, a plurality of N type ion implantation process and a plurality of P type ion implantation process are performed to form an N type light doped drain (N-LDD) 170 and an N type source/drain 175 in both sides of the second gate structure 146 and form a P type light doped drain (P-LDD) 180 and a P type source/drain 185 in both sides of the third gate structure 148. Since these processes of forming sources, drains, and light doped drains are performed according to the standard CMOS process, it should be understood by those skilled in the art without detailed description.

As in the aforementioned description, the first region 120 is used as a memory array region and the second region 130 is used as a peripheral circuit region, or a so-called logic region. However, the present invention is not limited thereto, but can be applied to integration of other type electric elements. For example, the second region 130 can be an SRAM region or a DRAM region.

In contrast to the prior art method, the method of the present invention forms the ONO layer 124, followed by forming the first silicon layer 126 and the nitride layer 128 covering on the ONO layer 124 before fabricating the electric elements in the peripheral region. Therefore, it is advantageous to use the present invention to protect the ONO layer 124 from being affected in the following cleaning, oxidizing, and etching processes so as to maintain the quality of the formed ONO layer and improve the reliability of the memory devices. In addition, since the gate structures 144, 146, and 148 are all composed of two stacked silicon layers, while the dopant concentrations in the gate structures increase for reducing the electrical resistance, these gate structures 144, 146, and 148 can prevent the dopants, such as boron ions, from penetrating the gate oxide layer, which either leads to damage in the gate oxide layer or induces threshold voltage shifts. Therefore, the reliability of the embedded memory can be improved significantly.

Those skilled in the art will readily observe that numerous modifications and alterations of the device may be made while retaining the teachings of the Invention. Accordingly, the above disclosure should be construed as limited only by the metes and bounds of the appended claims.

What is claimed is:

1. A method of forming a metal oxide semiconductor (MOS) transistor of an embedded memory comprising the following steps:

providing a semiconductor wafer comprising a substrate, the substrate being defined with a first region and a second region;

forming an oxide-nitride-oxide (ONO) layer, a first silicon layer, and a first dielectric layer sequentially on the surface of the semiconductor wafer;

performing a first photo-etching process to remove the first dielectric layer, the first silicon layer, and the ONO layer in the second region;

forming at least one gate oxide layer in the second region on the surface of the substrate;

forming a second silicon layer on the semiconductor wafer;

performing a second photo-etching process to remove the second silicon layer and the first dielectric layer in the first region;

forming the third silicon layer on the semiconductor wafer;

performing a third photo-etching process to form a gate of the MOS transistor in the first region and the second region respectively;

performing at least one first region ion implantation process to form a source and a drain of the MOS transistor in the first region; and performing at least one second region ion implantation process to form a source and a drain of the MOS transistor in the second region.

2. The method of claim 1 wherein the method further comprises the following steps before performing the third photo-etching process:

forming a silicide layer on the third silicon layer; and forming a second dielectric layer on the silicide layer.

3. The method of claim 1 wherein the second dielectric layer comprises a silicon nitride layer or a silicon oxide layer.

4. The method of claim 1 wherein the first region comprises a flash memory region or an EEPROM region.

5. The method of claim 1 wherein the second region comprises a logic region, SRAM region, or DRAM region.

6. The method of claim 1 wherein the first silicon layer, the second silicon layer, and the third silicon layer are composed of a polysilicon layer or an amorphous layer.

7. A method of forming an embedded memory comprising the following steps:

providing a semiconductor wafer, the semiconductor wafer comprising a substrate defined with a memory region and a peripheral region, the memory region comprising at least one cell-well and the peripheral region comprising at least one N-well and at least one P-well;

forming an ONO layer, a first silicon layer, and a first dielectric layer in sequence on the semiconductor wafer covering the memory region and the peripheral region;

performing a first photo-etching process to remove the first dielectric layer, the first silicon layer and the ONO layer in the peripheral region;

forming at least one gate oxide layer in the peripheral region on the surface of the substrate;

performing a chemical vapor deposition process to form a second silicon layer covering the surface of the semiconductor wafer;

performing a second photo-etching process to remove the second silicon layer and the first dielectric layer in the memory region;

forming at least a third silicon layer covering the memory region and the peripheral region on the surface of the semiconductor wafer;

performing a third photo-etching process to form a first gate, a second gate, and a third gate above each of the cell-well, the N-well, and the P-well;

performing a first ion implantation process to form a first drain and a first source at two sides of the first gate respectively;

performing a second ion implantation process to form a second source and a second drain at two sides of the second gate respectively; and performing a third ion implantation process to form a third source and a third drain at two sides of the third gate respectively.

8. The method of claim 7 wherein the method further comprises the following steps before performing the third photo-etching process:

forming a suicide layer on the third silicon layer; and forming a second dielectric layer on the silicide layer.

9. The method of claim 7 wherein the first dielectric layer comprises a silicon nitride layer or a silicon oxide layer.

10. The method of claim 7 wherein the first silicon layer, the second silicon layer, and the third silicon layer are composed of a polysilicon layer or an amorphous layer.

11. The method of claim 7 wherein the embedded memory is a SONOS flash memory, the first gate, the first drain, and the first source forming a stacked MOS transistor which serves as a memory cell of the SONOS flash memory.

12. The method of claim 11 wherein the first drain serves as a bit line of the SONOS flash memory and the first drain serves as a common drain.

13. The method of claim 7 wherein the embedded memory is a SONOS EEPROM, the first gate, the first drain, and the first source forming a stacked MOS transistor which serves as a memory cell of the SONOS EEPROM.

14. The method of claim 13 wherein the first drain serves as a bit line of the SONOS EEPROM and the first drain serves as a common drain.

* * * * *